United States Patent
Henderson et al.

(10) Patent No.: US 7,223,518 B2
(45) Date of Patent: May 29, 2007

(54) COMPOSITIONS AND METHODS OF USE THEREOF

(75) Inventors: Clifford L. Henderson, Douglasville, GA (US); Trevor Hoskins, Atlanta, GA (US); Cody M. Berger, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 85 days.

(21) Appl. No.: 10/862,759

(22) Filed: Jun. 7, 2004

(65) Prior Publication Data

US 2004/0248034 A1 Dec. 9, 2004

Related U.S. Application Data

(60) Provisional application No. 60/476,432, filed on Jun. 6, 2003.

(51) Int. Cl.
*G03F 7/004* (2006.01)

(52) U.S. Cl. .................. 430/270.1; 430/326; 430/921; 430/925; 430/922; 430/919

(58) Field of Classification Search ............ None
See application file for complete search history.

(56) References Cited

U.S. PATENT DOCUMENTS

| | | | | |
|---|---|---|---|---|
| 3,775,237 A * | 11/1973 | Crowley | ............ | 428/158 |
| 4,663,269 A * | 5/1987 | Narang et al. | ............ | 430/326 |
| 4,708,925 A * | 11/1987 | Newman | ............ | 430/270.1 |
| 4,720,445 A * | 1/1988 | Brahim et al. | ............ | 430/270.1 |
| 4,921,778 A | 5/1990 | Thackeray et al. | ............ | 430/326 |
| 5,093,224 A * | 3/1992 | Hashimoto et al. | ............ | 430/296 |
| 5,198,402 A * | 3/1993 | Kaji et al. | ............ | 502/167 |
| 5,356,740 A * | 10/1994 | Steinmann | ............ | 430/285.1 |
| 5,498,765 A | 3/1996 | Carpenter, Jr. et al. | ............ | 430/323 |
| 5,523,357 A * | 6/1996 | Peterson | ............ | 525/240 |
| 5,615,526 A * | 4/1997 | Palmer et al. | ............ | 52/302.1 |
| 5,635,332 A * | 6/1997 | Nakano et al. | ............ | 430/270.1 |
| 5,847,218 A | 12/1998 | Ohsawa et al. | ............ | 564/430 |
| 5,880,169 A | 3/1999 | Osawa et al. | ............ | 522/25 |
| 5,939,242 A * | 8/1999 | Tang et al. | ............ | 430/270.1 |
| 6,165,217 A * | 12/2000 | Hayes | ............ | 623/11.11 |
| 6,200,724 B1 | 3/2001 | Namiki et al. | ............ | 430/270.1 |
| 6,338,934 B1 * | 1/2002 | Chen et al. | ............ | 430/270.1 |
| 6,416,928 B1 | 7/2002 | Ohsawa et al. | ............ | 430/270.1 |
| 6,677,390 B1 | 1/2004 | Takahashi et al. | ............ | 522/31 |
| 6,692,893 B2 | 2/2004 | Ohsawa et al. | ............ | 430/270.1 |
| 2001/0009749 A1 * | 7/2001 | Yamana | ............ | 430/270.1 |

(Continued)

OTHER PUBLICATIONS

Jablonski et al , J. Vac. Sci. Tecnol. B 21 (6), Nov./Dec. 2003 with Publication date Dec. 10, 2003, pp. 3162-3165.*

(Continued)

*Primary Examiner*—Cynthia Hamilton
(74) *Attorney, Agent, or Firm*—Thomas, Kayden, Horstemeyer & Risley LLP

(57) ABSTRACT

Compositions and methods of use thereof are disclosed. One exemplary composition, among others, includes a polymer resin and a photoacid generator. In particular, the composition includes a polymer resin, wherein the polymer resin does not substantially absorb about 1 to 450 nanometer (nm) wavelength energy; and a photoacid generator, wherein the photoacid generator does substantially absorb about 1 to 450 nanometer (nm) wavelength energy.

16 Claims, 3 Drawing Sheets

U.S. PATENT DOCUMENTS

2001/0033990 A1* 10/2001 Hatakeyama et al. .... 430/270.1

OTHER PUBLICATIONS

Chamber et al, "Design of dissolution inhibitors for chemically amplited photolithographic systems", Advances in Resist Technology and PRocessing XXI, Sturtevant, John L. ed, Proceedings of the SPIE, vol. 5376, pp. 360-368, published May 1, 2004 from Conference of Feb. 23, 2004 at Bellingham, WA.*

Chambers et al,"Dissolution Inhibitors for 157 nm Photolithography" Advances in Reist Technology and Processing VV, Fedynyshyn, Theodore H, ed,Proceedings of the SPIE, vol. 5039, pp. 93-102, Jun. 2003, from Conference in Santa Clara, CA, Feb. 2003.*

Trinque et al, "Advances in Resists for 157nm Microlithography", Advances in Resist TEchnology and PRocessing XIX, Fedynyshyn, Theodore, ed, Proceedings of SPIE, vol. 4690 (Jul. 2002) SPIE from Conference in Santa Clara, CA, 2002.*

Kunz et al, "Outlook for 157-nm resist design",Part of the SPIE Conference on Advances in REsist TEchnology and Processing XVI, Santa Clar, California, Mar. 1999, SPIE vol. 3678.*

"Heteropolymer", Wikipedia, the free encyclopedia, http://en.wikipedia.org/wiki/Copolymer, two pages with last update of Jul. 25, 2006, http://en.wikipedia.org/wiki/Copolymer.*

"About" "Heteropolymer", one page, copyright 1989 CFC Press LLC., 2006 About, Inc, a part of the New York Times Companyhttp://composite.about.com/library/glossary/h/bldef-h2604.htm.*

Stenesh, J., "heteropolymer", Dictionary of Biochemistry and Molecular Biology (2nd Edition). John Wiley & Sons. p. 217, Online version available at: http://www.knovel.com/knovel2/Toc.jsp?BookID=968&VerticalID=0.*

"heteropolymer"Webster's Third New International® Dictionary, Unabridged, Copyright © 1993 Merriam-Webster, Incorporated. Published under license from Merriam-Webste http://lionreference.chadwyck.com/searchFulltext.do?id=15456925&idType=offset&divLevel=2&queryId=../session/1155318892_17244&area=mwd&forward=refshelf&trail=refshelf.*

RN 6542-67-2, REGISTRY file in ACS entered STN Nov. 16, 1984, one page.*

Hinsberg et al Lithographic Resists (Archive), Kirk-Othmer Encyclopedia of Chemical Technology, copyright 1998, John Wlley & Sones, Artcile Online posting date Dec. 4, 2000, 27 pages of text and attached Table, Figures and Bibliography.*

RN 74227-35-3, REGISTRY file on ACS entered STN Nov. 16, 1984 one page.*

RN 5495-84-1, REGISTRY file on ACS entered STN Nov. 16, 1984 one page.*

RN 104558-94-3, REGISTRY file on ACS entered STN Oct. 4, 1986 one page.*

RN 104558-95-4, REGISTRY file on ACS entered STN Oct. 4, 1986 one page.*

* cited by examiner

COMPOSITIONS AND METHODS OF USE THEREOF

CROSS-REFERENCE TO RELATED APPLICATION

This application claims priority to co-pending U.S. Provisional Application entitled "Use of Photoacid Generators as Dissolution Rate Modifiers for Advanced Photoresist Materials" having Ser. No. 60/476,432, filed on Jun. 6, 2003, which is entirely incorporated herein by reference.

TECHNICAL FIELD

The present disclosure is generally related to compositions, and, more particularly, is related to polymer compositions and methods of use thereof.

BACKGROUND

Future microlithography methods that will replace current 248 nm wavelength exposure processes may include processes based on 193 nm, 157 nm, or Extreme-Ultraviolet (EUV, ~13 nm) wavelengths. At these extremely low wavelengths, the design of transparent polymers, and thus photoresists based on such polymers, is a difficult problem due to the tendency for a wide variety of organic groups to absorb strongly in this ultraviolet wavelength range. Alternative functional groups, polymer backbone architectures, photoresist additives, and photoresist design and formulation strategies will be required to meet this challenge of developing new photoresists for these lower wavelength lithographic methods.

SUMMARY

Briefly described, embodiments of this disclosure, among others, include compositions and methods of use thereof. One exemplary composition, among others, includes a polymer resin and a photoacid generator. The polymer resin does not substantially absorb about 1 to 450 nanometer (nm) wavelength energy. The photoacid generator does substantially absorb about 1 to 450 nanometer (nm) wavelength energy. The composition has a ratio of a first dissolution rate and a second dissolution rate of greater than about 1.1. The first dissolution rate is measured prior to the composition being exposed to about 1 to 450 nm energy and the second dissolution rate is measured after the composition is exposed to about 1 to 450 nm energy without post thermal exposure.

Methods of using the composition described above are also provided. One exemplary method includes, among others: disposing a photoresist onto a surface, wherein the photoresist includes the composition described above; disposing a photomask onto the photoresist; exposing the photoresist through the photomask to optical energy about 1 to 450 nm energy; and removing portions of the photoresist exposed through the photomask.

Another exemplary method includes, among others: applying a photoresist on a wafer substrate, wherein the photoresist includes the composition described above and exposing the photoresist to a patterned activating radiation, and developing the exposed photoresist to provide a photoresist relief image.

Another exemplary method includes, among others: applying a photoresist on a wafer substrate, wherein the photoresist includes the composition described above and exposing the photoresist coating layer to patterned activating radiation of about 1 to 450 nm energy.

Another exemplary method includes, among others: applying a photoresist on a substrate, wherein the photoresist includes the composition described above, imagewise exposing the photoresist to form imaged and non-imaged areas, and developing the exposed photoresist layer having imaged and non-imaged areas to form the relief image on the substrate.

Other compositions, methods, features, and advantages will be, or become, apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of this disclosure can be better understood with reference to the following drawings.

DETAILED DESCRIPTION

Figure 1:
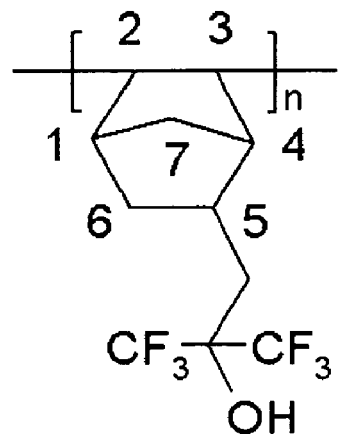
FIG. 1 illustrates a representative embodiment of a polymer resin, bis-trifluoromethyl carbinol substituted polynorbornene (HFAPNB).

In general, compositions and methods of use thereof, are disclosed. In general, the compositions can be used in areas such as, but not limited to, microelectronics (e.g., microprocessor chips, communication chips, and optoeletronic chips), microfluidics, sensors, analytical devices (e.g., microchromatography), and as a sacrificial material. In particular, the composition can be used as a photoresist and/or a sacrificial material in lithography processes and the like.

Embodiments of the composition include a polymer resin and a photoacid generator (PAG). The polymer resin does not substantially absorb about 1 to 450 nanometer (nm) wavelength energy. In particular, the polymer resin does not substantially absorb about 10 to 15 nm, about 110 to 140 nm, about 150 to 160 nm, about 190 to 200 nm, or about 240 to 260 nm. The PAG does substantially absorb about 1 to 450 nanometer (nm) wavelength energy. In particular, the photoacid generator does substantially absorb about 10 to 15 nm, about 110 to 140 nm, about 150 to 160 nm, about 190 to 200 nm, or about 240 to 260 nm. The weight percent of the PAG is at a level relative to the weight percent of the polymer resin, so that the composition is substantially transparent to optical energy from about 1 to 450 nm, 10 to 15 nm, about 110 to 140 nm, about 150 to 160 nm, about 190 to 200 nm, or about 240 to 260 nm.

The composition has a first dissolution rate, measured prior to exposure to about 1 to 450 nm energy, when introduced to a lithographic solvent. In addition, the composition has a second dissolution rate, measured after exposure to about 1 to 450 nm energy but prior to post thermal treatment (e.g., thermal baking of the composition (e.g., used as a photoresist film) after exposure at temperatures in the range of about 25° C. to 200° C. and for times ranging from about 1 second to 300 seconds), when introduced to a lithographic solvent. The lithographic solvent can include, but is not limited to, aqueous alkaline developers, organic solvent developers, super- and sub-critical solvents (e.g., such as liquid or supercritical carbon dioxide), and combinations thereof.

The ratio of the first dissolution rate and the second dissolution rate is greater than about 1.1, greater than about 2, greater than about 3, greater than about 4, greater than about 4.7, greater than about 5, greater than about 7, greater than about 9, greater than about 11, greater than about 13, greater than about 15, greater than about 17, greater than about 19, greater than about 21, greater than about 23, greater than about 25, and greater than about 27. In many embodiments the ratio is infinity since the first dissolution rate is zero (e.g., below the range of measurement, less than $10^{-5}$ nm/second), while the second dissolution rate is greater than zero.

The first dissolution rate can range from about $10^{-5}$ nm/sec to 50 nm/sec, about $10^{-5}$ nm/sec to 30 nm/sec, about $10^{-5}$ nm/sec to 20 nm/sec, about $10^{-5}$ nm/sec to 14 nm/sec, about $10^{-5}$ nm/sec to 12 nm/sec, about $10^{-5}$ nm/sec to 10 nm/sec, about $10^{-5}$ nm/sec to 7 nm/sec, and about $10^{-5}$ nm/sec to 5 nm/sec, prior to exposure to about 1 to 450 nm energy (e.g., including various ranges described above) when introduced to a lithographic solvent.

The second dissolution rate can range from about 1 nm/sec to 5000 nm/sec, about nm/sec to 5000 nm/sec, about 20 nm/sec to 5000 nm/sec, about 30 nm/sec to 5000 nm/sec, about 40 nm/sec to 5000 nm/sec, about 50 nm/sec to 5000 nm/sec, about 60 nm/sec to 5000 nm/sec, about 70 nm/sec to 5000 nm/sec, about 80 nm/sec to 5000 nm/sec, about 90 nm/sec to 5000 nm/sec, about 100 nm/sec to 5000 nm/sec, about 110 nm/sec to 5000 nm/sec, after to exposure to about 1 to 450 nm energy (e.g., including various ranges described above) when introduced to a lithographic solvent.

The first and second dissolution rates (i.e., and the appropriate ratio) can be selected based on the selection of the polymer resin and the PAG. Exemplary polymer resins and PAGs are discussed in Example 1 below.

Although not intending to be bound by theory, upon exposure to optical energy (e.g., 1 to 450 nm), the PAG generates an acid. Then, upon exposure to a basic functional group (e.g., the polymer resin), the dissolution of the composition is increased relative to a composition not exposed to optical energy.

The polymer resin can include compounds such as, but not limited to, alicyclic polymers, polynorbornenes, polyacrylates, polystyrenes, polycarbonates, polyethers, polyesters, functionalized compounds of each, co-polymers of each, tri-polymers of each, heteropolymers, and combinations thereof. In general, the polynorbornene can include, but is not limited to, carboxylic acid substituted norbornene, carbinol substituted norbornene, sulfonamide substituted norbornene, and combinations thereof. Specific examples of polynorbornenes include, but are not limited to, a carboxylic acid substituted polynorbornene, a bis-trifluoromethyl carbinol substituted polynorbornene, a trifluorosulfonamide substituted polynorbornene, and combinations thereof. In particular, the polynorbornene is a bis-trifluoromethyl carbinol substituted polynorbornene.

The polycarbonate can include, but is not limited to, functionalized forms of polypropylene carbonate (PPC), polyethylene carbonate (PEC), polycyclohexane carbonate (PCC), polycyclohexanepropylene carbonate (PCPC), and polynorbornene carbonate (PNC), and combinations thereof. Specific polycarbonates that may be used include, for example, carbinol substituted forms of poly[(oxycarbonyloxy-1,1,4,4-tetramethylbutane)-alt-(oxycarbonyloxy-5-norbornene-2-endo-3-endo-dimethane)]; poly[(oxycarbonyloxy-1,4-dimethylbutane)-alt-(oxycarbonyloxy-5-norbornene-2-endo-3-endo-dimethane)]; poly[(oxycarbonyloxy-1,1,4,4-tetramethylbutane)-alt-(oxycarbonyloxy-p-xylene)]; poly[(oxycarbonyloxy-1,4-dimethylbutane)-alt-(oxycarbonyloxy-p-xylene)], and combinations thereof.

In general, the molecular weight of the disclosed polymer resins is from about 10,000 to 200,000. In particular, the molecular weight of bis-trifluoromethyl carbinol substituted polynorbornene is from about 500 to 40,000.

The PAG can include compounds such as, but not limited to, diazonium salts, iodonium salts, sulfonium salts, or non-ionic PAGs (e.g., diazosulfonyl compounds, sulfonyloxy imides, and nitrobenzyl sulfonate esters), although any photosensitive compound that produces an acid upon irradiation may be used. In particular, the PAG can include, but is not limited to, iodonium salts and sulphonium salts.

The iodonium salt PAG can include, but is not limited to, diphenyliodonium trifluoromethane sulfonate, diphenyliodonium nonafluorobutane sulfonate, diphenyliodonium hexafluorophosphate, (4-methoxyphenyl) phenyliodoniumtrifluoromethane sulfonate, bis(p-tert-butylphenyl)iodonium trifluoromethanesulfonate, bis(4-tert-butylphenyl)iodonium nonaflate, diphenyl iodonium triflate, diphenyl iodonium antimonate, methoxy diphenyl iodonium triflate, di-t-butyl diphenyl iodonium triflate, 4-tert-butoxyphenylphenyliodonium, 4-methoxyphenylphenyliodonium, diphenyl iodonium nonaflate, methoxy diphenyl iodonium nonaflate, di-t-butyl diphenyl iodonium nonaflate, tetrakis (pentafluorophenyl) borate-4-methylphenyl[4-(1-methylethyl)phenyl]iodonium (DPI-TPFPB), bis(4-tert-butylphenyl)iodonium triflate (DTBPI-Tf), diphenyl iodonium perfluorooctane sulfonate, methoxy diphenyl iodonium perfluorooctane sulfonate, Rhodosil™ Photoinitiator 2074 (FABA), and combinations thereof. In particular, the iodonium salt PAG includes di-(p-t-butyl) phenyliodonium bis (perfluoromethanesulfonyl) imide (DTBPI-N1); di-(p-t-butyl) phenyliodonium bis(perfluoroethanesulfonyl) imide (DTBPI-N2); di-(p-t-butyl) phenyliodonium bis(perfluorobutanesulfonyl) imide (DTBPI-N3); di-(p-t-butyl) phenyliodonium bis(perfluoromethanesulfonyl) imide tris(perfluoromethanesulfonyl) methide (DTPBI-C1); bis(p-tert-butylphenyl)iodonium antimonate, and combinations thereof.

The sulphonium salt PAG can include, but is not limited to, triphenylsulfonium trifluromethane sulfonate, triphenylsulfonium nonafluorobutane sulfonate, triphenylsulfonium hexafluorophosphate, (4-methoxyphenyl) diphenylsulfonium trifluoromethanesulfonate, and (p-tert-butylphenyl) diphenylsulfonium trifluoromethanesulfonate, tris(4-t-butylphenyl)sulfonium tetrakis-(pentafluorophenyl)borate (TTBPS-TPFPB), tris(4-t-butylphenyl)sulfonium hexafluorophosphate (TTBPS-HFP), triphenylsulfonium triflate (TPS-Tf), triphenylsulfonium hexafluoroantimonate (TPS-103), triphenylsulfonium bis(perfluoromethanesulfonyl) imide (TPS-N1), triphenylsulfonium bis(perfluoroethanesulfonyl) imide (TPS-N2), triphenylsulfonium bis(perfluorobutanesulfonyl) imide (TPS-N3), triphenylsulfonium tris (perfluoromethanesulfonyl)methide (TPS-C1), and combinations thereof. In particular, the sulphonium salt PAG includes TPS-C1, CGI 268, TPS Nonaflate, TPS-N2, TPS-N1, and combinations thereof.

The PAG can also include nonionic PAGs such as, but not limited to, ethanone, 1,1'-[1,3-propanediylbis(oxy-4,1-phenylene)]bis[2,2,2-trifluoro-, bis[O-(propylsulfonyl)oxime] (CGI 263), ethanone, 1,1'-[1,3-toluenediylbis(oxy-4,1-phenylene)]bis[2,2,2-trifluoro-, bis[O-(propylsulfonyl)oxime] (CGI 268), (5-propanesulfonyloxyimino-5H-thiophen-2-ylidene)-2-methylphenyl acetonitrile (CGI 1311), (5-octanesulfonyloxyimino-5H-thiophen-2-ylidene)-2-methylphenyl acetonitrile (CGI 1325), (5-toluenesulfonyloxyimino-5H-thiophen-2-ylidene)-2-methylphenyl acetonitrile (CGI 1397), triazine (TAZ-101), and combinations thereof.

The polymer resin can be from about 0.5% to 50% by weight of the composition, about 5% to 40% by weight of the composition, and about 10% to 30% by weight of the composition. The PAG can be from about 0.0005% to 25% by weight of the composition, about 0.005% to 10% by weight of the composition, and about 0.01% to 5% by weight of the composition. Typically, the polymer resin and the PAG are dissolved in a solvent and the solvent is from about 40% to 99.5% by weight of the composition, about 60% to 95% by weight of the composition, and about 70% to 90% by weight of the composition.

The solvent can include compounds, such as, but not limited to, mesitylene MS, N-methyl-2-pyrrolidinone, propyleneglycol monomethyl ether acetate, N-butyl acetate, ethyl lactate, γ-butyrolactone, diglyme, ethyl 3-ethoxypropionate, and combinations thereof. In some embodiments, substantially the only components in the composition include the polymer resin, the PAG, and the solvent, which is advantageous because of cost and simplicity (e.g., fewer components to make the composition). However, certain embodiments of the composition could include, but are not limited to, dissolution inhibitors, basic compounds, photodecomposable bases, plasticizers, and combinations thereof.

Now having described the composition in general, the following describes exemplary embodiments for using the composition. In particular, the composition can be used as a photoresist, a sacrificial material, and a dielectric.

In general, the composition can be used by disposing a layer of the composition onto a substrate or portion thereof and/or onto a previously disposed layer of material on the substrate. A photomask is disposed onto the composition or portions thereof that encodes a photodefinable area (e.g., a pattern or relief image). Next, the composition is exposed through the photomask to optical energy. Then, the exposed composition can be removed using appropriate solvents. This process can be performed multiple times on one or more layers of the substrate.

The substrate can include substrates that can be used in systems such as, but not limited to, microprocessor chips, microfluidic devices, sensors, analytical devices, and combinations thereof. Exemplary materials include, but are not limited to, glasses, silicon, silicon compounds, germanium, germanium compounds, gallium, gallium compounds, indium, indium compounds, or other semiconductor materials and/or compounds. In addition, the substrate can include non-semiconductor substrate materials, including any dielectric material, metals (e.g., copper and aluminum), or ceramics or organic materials found n printed wiring boards, for example.

The composition can be deposited onto the substrate using techniques such as, for example, spin coating, doctor-blading, melt dispensing, sputtering, lamination, screen or stencil-printing, chemical vapor deposition (CVD), and plasma-based deposition systems.

It should be noted that additional components could be disposed on and/or within the substrate. The additional components can include, but are not limited to, electronic elements (e.g., switches and sensors), mechanical elements (e.g., gears and motors), electromechanical elements (e.g., movable beams and mirrors), optical elements (e.g., lens, gratings, and mirror), opto-electronic elements, fluidic elements (e.g., chromatograph and channels that can supply a coolant), and combinations thereof.

EXAMPLE 1

The following is a non-limiting illustrative example of an embodiment of this disclosure that is described in more detail in (Trevor Hoskins, Cody Berger, Peter J. Ludovice, Clifford L. Henderson, Larry D. Seger, Chun Chang, Larry Rhodes, "Effect of Photoacid Generator Additives on the Dissolution Behavior of Bis-Trifluoromethyl Carbinol Substituted Polynorbornene", submitted to Polymer), which is incorporated herein by reference. This example is not intended to limit the scope of any embodiment of this disclosure, but rather is intended to provide specific exemplary conditions and results. Therefore, one skilled in the art would understand that many conditions can be modified to produce a desired result, and it is intended that these modifications be within the scope of the embodiments of this disclosure.

Substituted polynorbornenes (PNB) are one potential material solution for providing transparent photoresist polymer resins for photolithography at both 193 nm and 157 nm wavelengths. The polynorbornene (PNB) backbone provides a relatively transparent alicyclic polymer structure with suitable plasma etch resistance. The incorporation of bis-trifluoromethyl carbinol side groups, otherwise also known as hexafluoroalcohol (HFA), into polynorbornene polymers (see FIG. 1) provides a number of desired characteristics for a resist resin including, but not limited to: (1) solubility in the common aqueous alkaline developers used for resist processing; (2) ability to add acid-labile protecting groups to the polymer for producing chemically amplified resists resins with high contrasts; and (3) reduction of the absorbance coefficient of the polymer due to the incorporation of fluorine. FIG. 1 illustrates the structure of bis-trifluoromethyl carbinol substituted polynorbornene (HFAPNB).

Previously it was discovered that HFAPNB displays unusual dissolution behavior and that the dissolution rate of these polymers depends strongly on the ability of polymer chains to form hydrogen bonds (T. Hoskins, D. Chung, A. Agrawal, P. Ludovice, C. Henderson, L. Seger, L. Rhodes and R. Schick, "Bis-trifluoromethyl carbinol substituted polynorbornenes: Dissolution Behavior" (submitted to Macromolecules), T. Hoskins, W. J. Chung, P. J. Ludovice, C. L. Henderson, L. Seger, L. F. Rhodes and R. A. Shick, Proceedings of SPIE—The International Society for Optical Engineering, 5039, 600–611 (2003).). This propensity for HFAPNB materials to strongly hydrogen bond, combined with the impact that this hydrogen bonding has on the dissolution rate of the polymer, provides a variety of opportunities for the formulation of resist additives (i.e., dissolution inhibitors, etc.) that make use of such hydrogen bonding interactions to inhibit or otherwise modify the dissolution behavior of these materials.

One of the goals of this work has been the development of dissolution inhibitors that can be used to improve the contrast and minimize dark loss in positive tone photoresist materials based on polynorbornene systems, particularly those incorporating HFA substituent groups. In particular, significant effort has been directed at the development of inhibitors that can be made to change their dissolution inhibition behavior in response to exposure to ultraviolet light, either through a direct photochemical reaction or through reaction with other photogenerated species such as photoacids. Ideally, such a photoswitchable dissolution inhibitor would strongly inhibit the dissolution rate of the resist polymer in its native state and then display significantly reduced inhibition, or possibly even dissolution acceleration, after ultraviolet exposure.

Photoacid generators (PAGs) are a common and required ingredient in all modern chemically amplified photoresists. In a conventional positive tone chemically amplified photoresist, the polymer resin which constitutes the majority of the resist is rendered insoluble in aqueous alkaline developers by "blocking" or "protecting" hydroxyl sites on the polymer with acid-labile functionalities such as the tertiary-butoxycarbonyl (t-BOC) group. A small amount of a photoacid generator is added to the photoresist formulation, which upon exposure to ultraviolet light, produces a strong acid. The presence of this strong acid in the exposed regions of the photoresist serves to catalyze the "deprotection" reaction that again renders the resist matrix polymer soluble in aqueous alkaline developers. Photoacid generators take on a variety of forms, but many such compounds are strongly polar molecules that may themselves have a tendency to form hydrogen bonds. In thinking about the design of inhibitor molecules, it became clear that photoacid generators themselves could potentially have the ability to produce the desired photoswitchable inhibition effect.

EXPERIMENTAL

Materials: All HFAPNB polymers were provided by Promerus LLC of Brecksville, OH and were polymerized using a palladium catalyst in a manner described previously. The poly(hydroxystyrene) (PHOST) used was provided by TriQuest, LP, a subsidiary of ChemFirst, Inc. PGMEA (propylene glycol methyl ether acetate) was purchased from Aldrich Chemicals and was used as the casting solvent for all prepared films. The various aqueous alkaline developer solutions used were prepared by appropriate dilution of AZ 300 MIF developer, a tetramethyl ammonium hydroxide (TMAH) based product, which was provided by AZ Electronic Materials.

Figure 2:
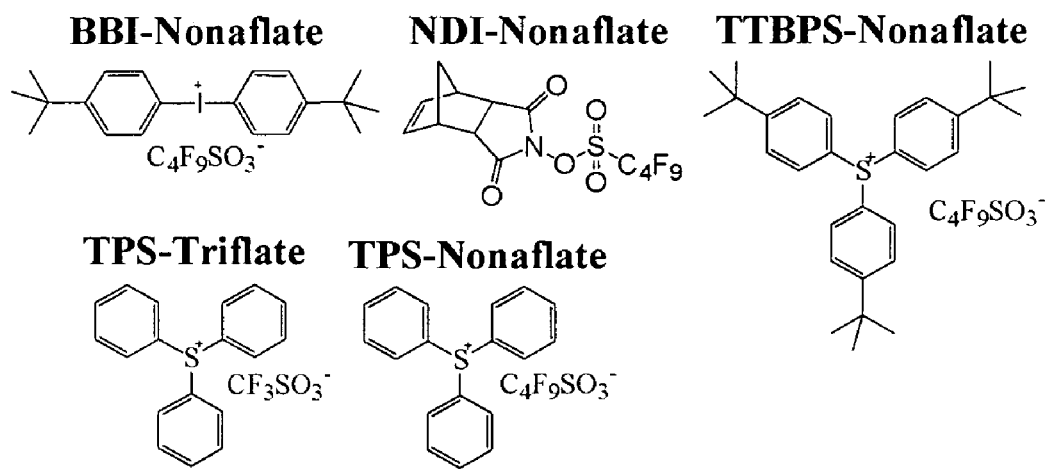
FIG. 2 illustrates representative photoacid generators.
Figure 3:
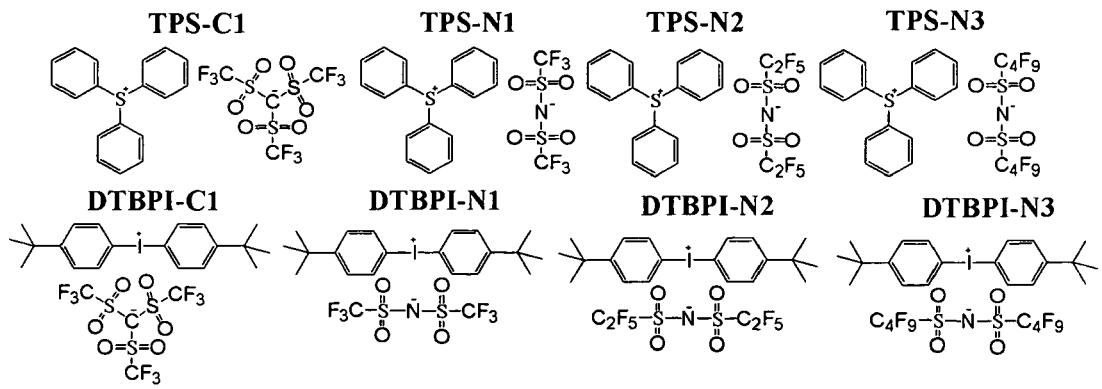
FIG. 3 illustrates additional representative photoacid generators.
Figure 4:
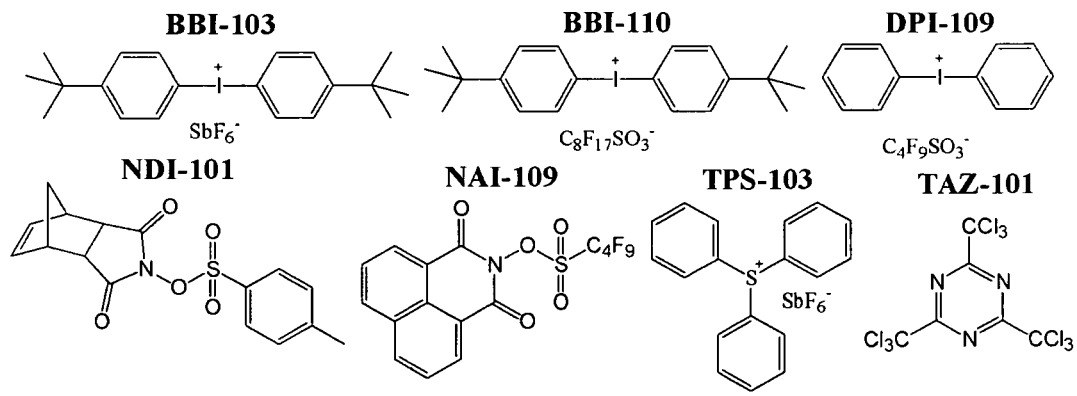
FIG. 4 illustrates additional representative photoacid generators.
Figure 5:
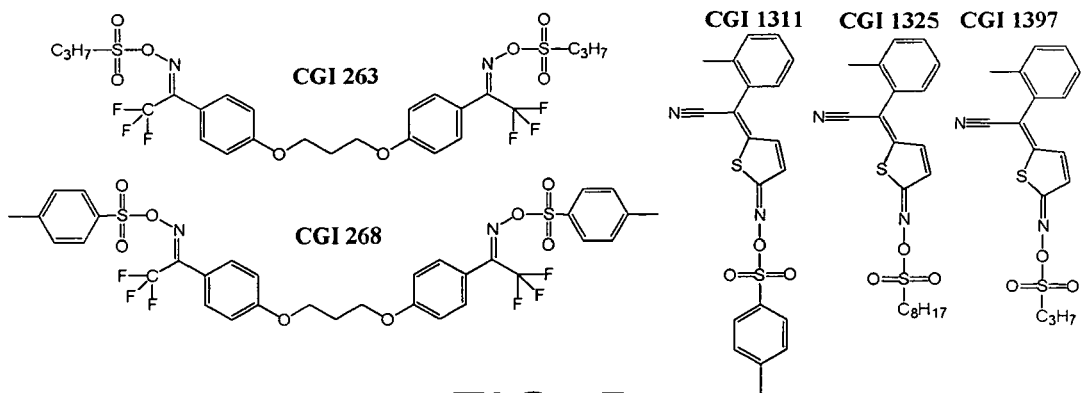
FIG. 5 illustrates additional representative photoacid generators.

A large series of photoacid generators were used and were obtained from a variety of sources. The following five photoacid generators were purchased from Aldrich Chemicals (see FIG. 2): triphenylsulfonium (TPS) nonaflate; triphenylsulfonium triflate; di-4-tert-butyl diphenyliodonium (BBI) nonaflate; Tris(4-tert-butylphenyl)sulfonium (TTBPS) nonaflate; and 5-Norbornene-2,3-dicarboximidyl (NDI) nonaflate. Eight photoacid generators were provided by 3M Corporation (see FIG. 3): triphenylsulfonium bis(perfluoromethanesulfonyl) imide (TPS-N1); triphenylsulfonium bis(perfluoroethanesulfonyl) imide (TPS-N2); triphenylsulfonium bis(perfluoropropanesulfonyl) imide (TPS-N3); triphenylsulfonium tris(perfluoromethanesulfonyl) methide (TPS-C1), DTPBI-C1, DTPBI-N1, DTPBI-N2, and DTPBI-N3. Seven photoacid generators were purchased from Midori Corporation (see FIG. 4): Di-4-tert-butyl diphenyliodonium perfluorooctanesulfonate (BBI-110), diphenyliodonium (DPI) nonaflate (DPI-109), 5-norbornene-2,3-dicarboximidyl tosylate (NDI-101), Di-4-tert-butyl diphenyliodonium hexafluoroantimonate (BBI-103), triphenylsulfonium hexafluoroantimonate (TPS-103), 2,4,6-Tris(trichloromethyl)-1,3,5-triazine (TAZ-101), and 1H-benz[de]isoquinoline-1,3(2H)-dione, 2-[[(nonafluorobutyl)sulfonyl]oxy]-(NAI-109). Finally, five photoacid generators were provided by Ciba (see FIG. 5): CGI 263, CGI 268, CGI 1311, CGI 1325, and CGI 1397.

Dissolution Rate Measurements: The PAG loading for all dissolution inhibition studies was maintained at 3 wt % PAG relative to total solids, and the HFAPNB polymer-PAG mixtures were prepared as 16 wt % (total solids) solutions in PGMEA. Polymer-PAG solutions containing PHOST were prepared as 20 wt % (total solids) solutions in PGMEA. The HFAPNB homopolymer used in formulating these solutions had a $M_w$ of 8,900 and a polydispersity index (PDI) of 2.7. The PHOST polymer used in this work had a $M_w$ of 20,000 and a PDI of 2.0. HFAPNB resist solutions were spin-coated onto 4 inch silicon wafers at 2000 rpm for 30 s. PHOST resist solutions were spin-coated onto 4 inch silicon wafers at 5000 rpm for 30 s. All films were soft-baked at 130° C. for 90 s. Exposure of the polymer-PAG films was achieved using an Oriel Instruments (Model 87530) exposure tool in conjunction with a 248 nm bandpass filter, and samples were exposed to a total dose of approximately 500 mJ/cm$^2$. Based on previous studies with this series of PAGs, it was deemed that this large dose was more than sufficient to result in essentially complete decomposition of all of the PAGs used in this work. No post-exposure bake was used for the PAG inhibition study since the HFAPNB homopolymer is not protected and no reaction of the polymer with the PAG is expected. Dissolution rates for both unexposed and exposed films were measured in 0.22N TMAH using a multi-wavelength dissolution rate monitor. This TMAH concentration was chosen in order to maintain the measured film dissolution rates in a range that could be accurately measured using the multi-wavelength dissolution rate monitor.

FTIR Measurements: Fourier Transform Infrared Spectroscopy was performed using a Bruker KLS/088 FTIR. The optics and sample chamber were maintained under vacuum throughout the measurement to reduce interference from water. Two different types of polymer samples cast from PGMEA, containing either no PAG or 3 wt % PAG by total solids, were used for the FTIR measurements. The HFAPNB homopolymer used in these FTIR studies was identical to that used in the dissolution rate studies and had a $M_w$ of 8,900 and a PDI of 2.7. Resist solutions were spin-coated onto a ZnSe crystal at 2000 rpm for 30 s, then soft-baked at 130° C. for 90 s. The effect of ultraviolet exposure on the extent of hydrogen bonding in these HFAPNB-PAG systems was investigated by exposing the samples to deep-ultraviolet light using the DUV filtered Oriel exposure tool mentioned previously to a total dose of approximately 500 mJ/cm$^2$. FTIR spectra were collected before and after exposure, and the hydroxyl peak areas between approximately 3400 cm$^{-1}$ and 3600 cm$^{-1}$ were examined to determine any changes in the extent and nature of hydrogen bonding in of the polymer film matrix.

Figure 6:
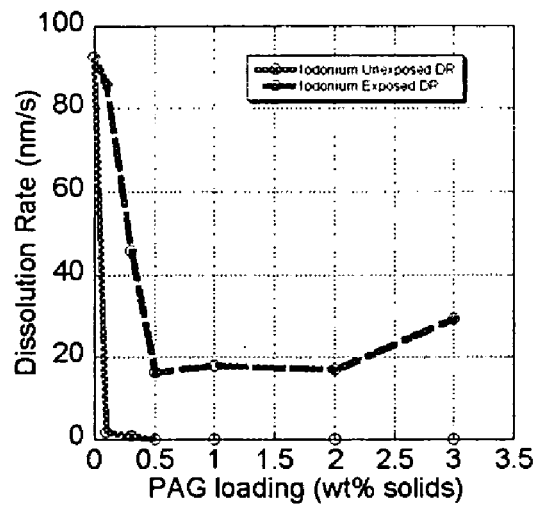
FIG. 6 illustrates a Meyerhofer plot of a di-4-tert-butyl diphenyliodonium salt photoacid generator (iodonium PAG DTBPI-N2).

Imaging Results: A Meyerhofer plot (see FIG. 6) using an iodonium PAG, (DTPBI-N2), in conjunction with a HFAPNB polymer was prepared in order to examine the ability to formulate photodefinable materials using only a mixture of PAG and HFAPNB. For generating Meyerhofer plots, the PAG loading varied from zero to 3 wt % by solids and the total solution contained 20 wt % by solids in PGMEA. The HFAPNB homopolymer used in these films had a $M_w$ of 5,700 and a PDI of 1.9. For measuring the dissolution rate of exposed polymer-PAG films, the films were exposed using an Oriel Instruments (Model 87530) exposure tool in conjunction with a 248 nm bandpass filter to a total dose of approximately 500 mJ/cm². Dissolution rates for both unexposed and exposed films were measured in 0.215 TMAH using a multi-wavelength dissolution rate monitor.[16]

A contrast curve was also generated using the same DTPBI-N2 iodonium PAG and HFAPNB homopolymer ($M_w$=5,700 and PDI=1.9) that was used to generate the Meyerhofer plot. For this contrast curve, PAG was loaded at 3 wt % by solids, and the total solution contained 20 wt % by solids in PGMEA. Silicon wafers were primed with hexamethyldisilazane (HMDS) to improve adhesion of the polymer film onto the substrate. Resist solutions were spin coated onto a 4 inch silicon wafer at 2000 rpm for 30 s, then soft baked at 130 C for 90 s. This spin-coating procedure yields a film thickness of 525 nm. Contrast curves were generated by exposing an open frame grid array using the Oriel exposure tool mentioned previously at doses ranging between zero and 135 mJ/cm². After exposure, films were developed in 0.22 N TMAH for sixty seconds. These films had an average dark loss of 43 nm. Using the same resist solution and spin-coating procedure, patterns ranging from ten to forty microns in size were printed into the resist film using contact lithography with a chrome on quartz mask in conjunction with the Oriel exposure tool via 248 nm exposure at a dose of 80 mJ/cm². After exposure, films were developed in 0.22 N TMAH for sixty seconds. Digital images of these patterns were captured using a Hitachi 3500H SEM.

RESULTS

Experiments were performed in which a variety of commercially available photoacid generators were tested to explore their impact on the dissolution behavior of HFAPNB homopolymers. Table 1 shows the results of measuring the dissolution rates of both the unexposed and exposed HFAPNB films loaded with the various PAGs using the protocols described above. As a point of reference, three photoactive salts (triphenylsulfonium chloride, diphenyliodonium chloride, and Di-4-tert-butyl diphenyliodonium chloride) were also added to show the potential to use photoactive compounds other than conventional photoacid generators. It was found that these compounds could indeed slightly inhibit the dissolution rate of the polymer and that upon exposure the dissolution rate of the exposed polymer increased. These effects are believed to be the result mainly of hydrophobic effects.

TABLE 1

PAG inhibition in HFAPNB

| Photoacid | DR Unexposed | DR Exposed | Rmax/Rmin |
|---|---|---|---|
| No PAG | 94.4 | 94.4 | 1.00 |
| CGI | 6.5 | 6.7 | 1.03 |
| NDI-101 | 30.4 | 32.7 | 1.07 |
| NDI-Nonaflate | 8.0 | 8.6 | 1.08 |
| CGI | 9.8 | 11.0 | 1.12 |
| TAZ-101 | 48.4 | 61.1 | 1.26 |
| DPI-109 | 5.7 | 8.0 | 1.42 |
| NAI-109 | 6.8 | 9.8 | 1.44 |
| CGI | 10.5 | 22.2 | 2.12 |
| TPS-N3 | 20.6 | 43.8 | 2.13 |
| BBI-Nonaflate | 3.0 | 6.8 | 2.31 |
| TPS-103 | 5.1 | 12.2 | 2.42 |
| TPS-Triflate | 1.9 | 5.9 | 3.14 |

TABLE 1-continued

PAG inhibition in HFAPNB

| Photoacid | DR Unexposed | DR Exposed | Rmax/Rmin |
|---|---|---|---|
| TPS-N1 | 14.1 | 44.3 | 3.15 |
| BBI-103 | 3.7 | 12.0 | 3.25 |
| CGI | 10.7 | 34.8 | 3.26 |
| TPS-N2 | 12.9 | 43.5 | 3.38 |
| TPS-Chloride | 32.3 | 115.8 | 3.59 |
| TPS-Nonaflate | 7.3 | 32.0 | 4.39 |
| TPS-C1 | 12.0 | 54.1 | 4.51 |
| TTBPS-Nonaflate | 2.6 | 12.2 | 4.76 |
| CGI | 1.4 | 37.4 | 27.48 |
| BBI-110 | 0.0 | 5.8 | 8 |
| DTBPI-N1 | 0.0 | 42.2 | 8 |
| DTBPI-N3 | 0.0 | 45.1 | 8 |
| DTBPI-C1 | 0.0 | 48.5 | 8 |
| DTBPI-N2 | 0.0 | 51.2 | 8 |

In addition to hydrogen bonding that can occur between HFAPNB polymer chains, the addition of a photoacid generator to the polymer film allows for the formation of hydrogen bonds between the photoacid generator molecules and HFAPNB polymer chain. It is possible for HFA sites on the polymer chain that would not otherwise be able to participate in hydrogen bonds with neighboring HFA groups due to chain packing and spacing limitations to form hydrogen bonds with a PAG molecule, thus leading to an overall increase in the extent of hydrogen bonding in the polymer. The hydrogen bonding of the polymer to the PAG is hypothesized to further retard the polymer dissolution rate. During exposure, the PAG is decomposed into a variety of photoproducts, which can subsequently disrupt this hydrogen bonding, thus leading to an increase in the dissolution rate of the material. From previous work, changes in the hydrogen bonding in HFAPNB polymer films can be characterized through the ratio of the free and "bonded" hydroxyl groups via FTIR spectroscopy. As hydrogen bonding in the polymer film increases, this "free" to "bonded" hydroxyl peak ratio will decrease. Using the ratio of the "free" (at ~3600 cm$^{-1}$) to "bonded" (at ~3500 cm$^{-1}$) hydroxyl peak heights in FTIR spectra of the films, the changes in hydrogen bonding due to the addition of photoacid generators was observed. This ratio for the pure HFAPNB homopolymer without PAG is 2.2. After addition of an iodonium PAG (DTPBI-N2) at 3 wt % by solids, the ratio between free and hydrogen bonded hydroxyl peaks decreases to 1.5, which corresponds to an increase in hydrogen bonding in the polymer thin film. After flood exposure of the iodonium PAG loaded polymer film at 248 nm, the ratio between free and hydrogen bonded peaks is 1.9, corresponding to a decrease in hydrogen bonding after exposure; The observation that the extent of hydrogen bonding is still more extensive in the exposed iodonium PAG loaded HFAPNB film than the pure homopolymer can explain the remnant dissolution inhibition observed in the exposed polymer films.

Table 1 shows several interesting results. First, all of the PAGs that were tested were found to strongly inhibit the dissolution of the HFAPNB polymer. However, what is striking from this data is that some of the iodonium PAGs studied in this work were found to completely inhibit the dissolution (e.g. displaying dissolution rates less than 1 Å/second) of the HFAPNB homopolymer. These results are unexpected and there appears to be no other case of such strong inhibition by a PAG of the dissolution rate of a polymer resin previously demonstrated in the literature. Furthermore, the analogous triphenylsulfonium salts do not completely inhibit the dissolution of the HFAPNB polymer, which in turn makes the success of the iodonium salts even more surprising. It would be expected that the important functional groups, such as the sulphonyl moieties, for promoting hydrogen binding between the PAG and polymer reside in the cation portion of the PAG. However, changing the PAG anion has a surprisingly strong effect on the ability of the PAG to inhibit the dissolution rate of the polymer and is not easily predicted.

In order to explore the relative strength and uniqueness of this PAG inhibition effect in the HFAPNB polymers, the dissolution inhibition of some of the photoacid generators were measured in poly(hydroxystyrene) (PHOST), the common deep-UV photoresist resin. Table 2 shows the results of this study. PHOST is known to exhibit extensive hydrogen bonding of the hydroxyl sites in the pure polymer, and thus it would be expected that this pre-existing hydrogen bonding would leave few "free" hydroxyl groups available for forming additional hydrogen bonds with other additives such as a PAG. Therefore, it might be expected that the level of dissolution inhibition in PHOST from PAG addition would be significantly lower than that observed in HFAPNB.

TABLE 2

PAG inhibition in PHOST

| Photoacid Generator | DR Unexposed (nm/s) | DR Exposed (nm/s) | Rmax/Rmin |
|---|---|---|---|
| No PAG | 65.4 | 65.4 | 1.00 |
| NAI-109 | 60.8 | 62.9 | 1.04 |
| CGI 1397 | 46.1 | 47.7 | 1.04 |
| CGI 1311 | 51.2 | 54.5 | 1.06 |
| NDI-Nonaflate | 62.5 | 66.9 | 1.07 |
| CGI 261 | 51.9 | 60.8 | 1.17 |
| DTBPI-N2 | 58.6 | 69.9 | 1.19 |
| CGI 1325 | 41.7 | 50.2 | 1.21 |
| TPS-Nonaflate | 47.8 | 62.8 | 1.31 |
| CGI 268 | 43.7 | 57.8 | 1.32 |
| TTBPS-Nonaflate | 39.3 | 57.4 | 1.46 |
| TPS-N2 | 41.2 | 62.2 | 1.51 |
| DTBPI-C1 | 44.0 | 72.6 | 1.65 |
| DTBPI-N3 | 37.8 | 68.1 | 1.80 |
| DTBPI-N1 | 36.8 | 68.2 | 1.85 |
| TPS-C1 | 34.4 | 70.7 | 2.05 |
| BBI-110 | 28.6 | 60.5 | 2.11 |
| TPS-N1 | 29.3 | 62.0 | 2.12 |
| TPS-N3 | 30.6 | 65.7 | 2.15 |
| DPI-109 | 23.0 | 53.0 | 2.30 |
| BBI-103 | 8.4 | 47.2 | 5.64 |
| TPS-Triflate | 7.2 | 45.0 | 6.22 |
| BBI-Nonaflate | 7.1 | 61.1 | 8.58 |

As expected, the PAGs tested did not inhibit the dissolution of PHOST as dramatically as that observed in HFAPNB. For example, the dissolution inhibition of one of the strongest PAG inhibitors in both polymers, the TPS-Triflate, was 89% in PHOST as compared to 98% for unexposed HFAPNB. Furthermore, the vast majority of PAGs tested with the PHOST made substantially less impact in terms of dissolution inhibition as compared to the same PAGs used in the HFAPNB polymer. The degree of dissolution inhibition was characterized by comparing the dissolution rate of the unexposed resist film to the dissolution rate of the pure homopolymer. The complete inhibition of the unexposed polymer resin by iodonium PAGs observed in HFAPNB is also not present in PHOST. Finally, there is virtually no dissolution inhibition observed in PHOST due to the presence of the PAG photoproducts, unlike the dramatic inhibition seen in the exposed PAGs with HFAPNB. This may indicate that it is predominantly the hydrophobicity of the PAGs that are responsible for the inhibition observed in PHOST matrices. The addition of a hydrophobic species would serve to retard the dissolution rate of the PAG-PHOST mixture, but once the PAG is decomposed the ionic species generated should, in general, be soluble in aqueous alkaline developer solutions and thus no longer retard the dissolution of the mixture. In the case of the HFAPNB, since it is believed that the inhibition effect is due primarily to the hydrogen bonding interaction of the PAG and polymer, the ability of PAG photoproducts to continue to hydrogen bond with the polymer would explain the remaining significant dissolution inhibition observed in these materials after exposure.

It is obvious from these results that the PAGs investigated in this work can function as photosensitive dissolution inhibitors in HFAPNB. Since the HFAPNB matrix contains no reactive functional groups, it is the change in the interactions of the PAG with the polymer and in the physical properties of the PAG itself that are responsible for the observed changes in dissolution rate, not any reactions induced by the generation of the acid in the film. In some cases (e.g., the iodonium PAGs) the photoacid generator is an extraordinarily good inhibitor for the polymer. Upon exposure, it is observed that the dissolution rate of the polymer returns to roughly half of the value of the pure HFAPNB resin. Therefore, it should be possible to form a photodefinable material using a mixture of only the HFAPNB homopolymer and a photoacid generator.

As a demonstration of the ability to formulate such a simple two component, photodefinable material, imaging experiments were performed using a system composed of HFAPNB and one of the iodonium PAGs, (DTPBI-N2). In order to determine the impact of PAG loading on the dissolution behavior of such a mixture, a Meyerhofer plot (see FIG. 6) using the DTPBI-N2 iodonium PAG was prepared.

Figure 7:
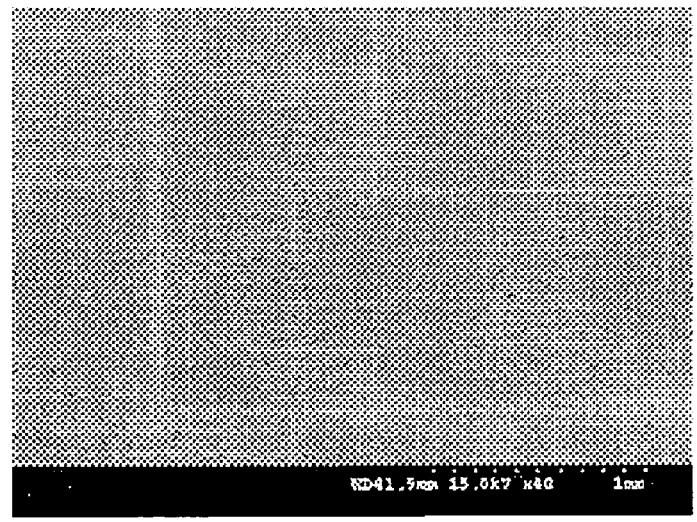
FIG. 7 illustrates lithographic patterns in protected HFAPNB.

Complete inhibition of the unexposed homopolymer was observed for PAG loadings as low as 0.5 wt % by solids. Even at a PAG loading of 0.1 wt % by solids, the unexposed homopolymer dissolution rate is reduced by 98% as compared to the pure HFAPNB resin. From the Meyerhofer plot, it was decided to form a photodefinable material using a PAG loading of 3 wt % by solids in HFAPNB. This PAG loading was found to completely inhibit the unexposed HFAPNB homopolymer while producing the least amount of inhibition in the exposed HFAPNB homopolymer. Using the 3 wt % DTPBI-N2 PAG loading in an HFAPNB homopolymer, the resist formulation has a contrast of 2.32 with a dose to clear of 62 mJ. Simple patterns were then exposed into this material using contact printing at 248 nm as a demonstration of the ability to pattern such a simple two component PAG-polymer system. FIG. 7 shows a SEM image of a simple set of line patterns formed in this material.

CONCLUSIONS

It has been shown that photoacid generators strongly inhibit the dissolution rate of HFAPNB polymers in aqueous alkaline solutions. Iodonium salt photoacid generators in particular were found to completely inhibit the dissolution of HFAPNB. It is hypothesized that the strong dissolution inhibition by PAGs in HFAPNB is due to hydrogen bonding between the PAGs and the HFAPNB. Such changes in the extent of hydrogen bonding for HFAPNB materials were confirmed by FTIR. It was also shown that photodefinable materials could be made using simple two-component PAG-HFAPNB mixtures.

It should be emphasized that the above-described embodiments of this disclosure are merely possible examples of implementations, and are set forth for a clear understanding of the principles of this disclosure. Many variations and modifications may be made to the above-described embodiments of this disclosure without departing substantially from the spirit and principles of this disclosure. All such modifications and variations are intended to be included herein within the scope of this disclosure and protected by the following claims.

The invention claimed is:

1. A composition, comprising:
   a polymer resin, wherein the polymer resin is a polynorbornene, wherein the polymer resin does not substantially absorb about 1 to 450 nanometer (nm) wavelength energy; and
   a photoacid generator, wherein the photoacid generator does substantially absorb about 1 to 450 nanometer (nm) wavelength energy, wherein the composition has a ratio of a second dissolution rate divided by a first dissolution rate that is greater than about 1.1, and wherein the first dissolution rate is measured prior the composition being exposed to about 1 to 450 nm wavelength energy and the second dissolution rate is measured after the composition is exposed to about 1 to 450 nm wavelength energy without post thermal exposure, wherein the first dissolution rate and the second dissolution rate are measured upon introduction to an aqueous alkaline developer, wherein the photoacid generator is selected from di-(p-t-butyl) phenyliodonium bis(perfluoromethanesulfonyl) imide, di-(p-t-butyl) phenyliodonium bis(perfluoroethanesulfonyl) imide, di-(p-t-butyl) phenyliodonium bis(perfluoropropanesulfonyl) imide, di-(p-t-butyl) phenyliodonium bis(perfluoromethanesulfonyl) imide tris(perfluoromethanesulfonyl) methide, bis(p-tert-butylphenyl)iodonium antimonate, and combinations thereof.

2. The composition of claim 1, the photoacid generator is about 0.0005 to 25% by weight percent of the composition and the polymer resin is from about 0.05 to 25% by weight of the composition.

3. The composition of claim 1, wherein the polynorbornene is a bis-trifluoromethyl carbinol substituted polynorbornene.

4. The composition of claim 3, wherein the polymer resin does not substantially absorb about 240 to 260 nm wavelength energy.

5. The composition of claim 1, wherein the polymer resin does not substantially absorb about 240 to 260 nm wavelength energy.

6. A composition, comprising:
   a polymer resin, wherein the polymer resin is a polynorbornene, wherein the polymer resin does not substantially absorb about 1 to 450 nanometer (nm) wavelength energy; and
   a photoacid generator, wherein the photoacid generator does substantially absorb about 1 to 450 nanometer (nm) wavelength energy, wherein the composition has a ratio of a second dissolution rate divided by a first dissolution rate that is greater than about 1.1, and wherein the first dissolution rate is measured prior the composition being exposed to about 1 to 450 nm wavelength energy and the second dissolution rate is measured after the composition is exposed to about 1 to 450 nm wavelength energy without post thermal exposure, wherein the first dissolution rate and the second dissolution rate are measured upon introduction to an aqueous alkaline developer, wherein the photoacid generator is a nonionic photoacid generator.

7. The composition of claim 6, the photoacid generator is about 0.0005 to 25% by weight percent of the composition and the polymer resin is from about 0.05 to 25% by weight of the composition.

8. The composition of claim 6, wherein the polynorbornene is a bis-trifluoromethyl carbinol substituted polynorbornene.

9. The composition of claim 7, wherein the polymer resin does not substantially absorb about 240 to 260 nm wavelength energy.

10. The composition of claim 6, wherein the polymer resin does not substantially absorb about 240 to 260 nm wavelength energy.

11. The composition of claim 6, wherein the nonionic photoacid generator is selected from:

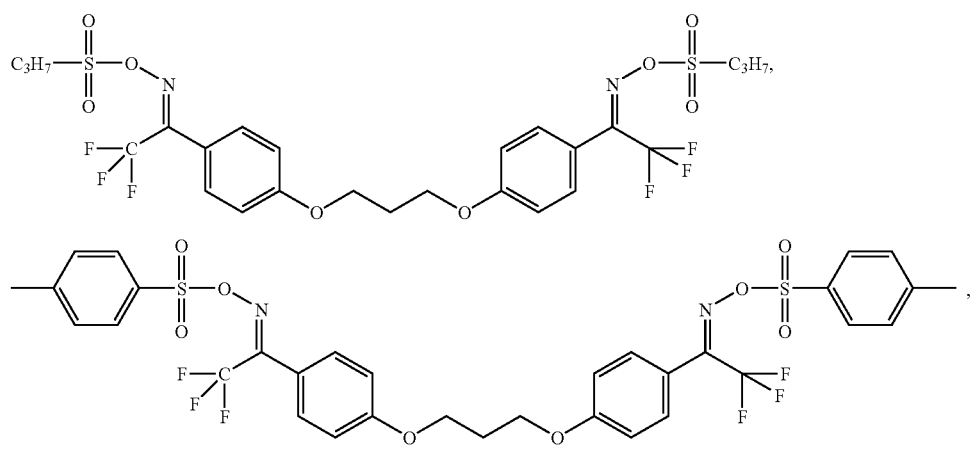

-continued

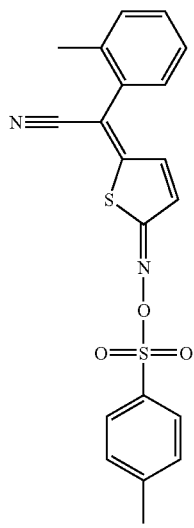
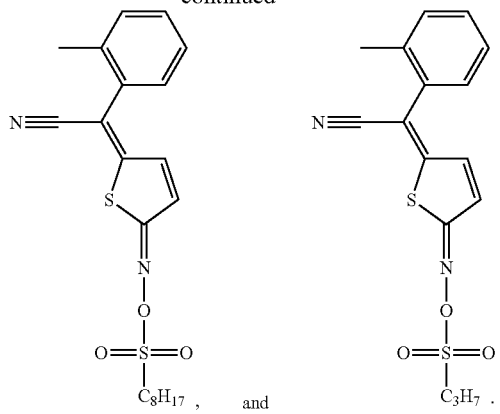

12. A composition, consisting essentially of:
a polymer resin, wherein the polymer resin is a polynorbornene, wherein the polymer resin does not substantially absorb about 1 to 450 nanometer (nm) wavelength energy;
a photoacid generator, wherein the photoacid generator does substantially absorb about 1 to 450 nanometer (nm) wavelength energy, wherein the composition has a ratio of a second dissolution rate divided by a first dissolution rate that is greater than about 1.1, and wherein the first dissolution rate is measured prior the composition being exposed to about 1 to 450 nm wavelength energy and the second dissolution rate is measured after the composition is exposed to about 1 to 450 nm wavelength energy without post thermal exposure, wherein the first dissolution rate and the second dissolution rate are measured upon introduction to an aqueous alkaline developer, wherein the photoacid generator is selected from di-(p-t-butyl) phenyliodonium bis(perfluoromethanesulfonyl) imide, di-(p-t-butyl) phenyliodonium bis(perfluoroethanesulfonyl) imide, di-(p-t-butyl) phenyliodonium bis(perfluoropropanesulfonyl) imide, di-(p-t-butyl) phenyliodonium bis(perfluoromethanesulfonyl) imide tris(perfluoromethanesulfonyl) methide, bis(p-tert-butylphenyl)iodonium antimonate, and combinations thereof; and
a solvent.

13. The composition of claim 12, the photoacid generator is about 0.0005 to 25% by weight percent of the composition and the polymer resin is from about 0.05 to 25% by weight of the composition.

14. The composition of claim 12, wherein the polynorbornene is a bis-trifluoromethyl carbinol substituted polynorbornene.

15. The composition of claim 9, wherein the polymer resin does not substantially absorb about 240 to 260 nm wavelength energy.

16. The composition of claim 12, wherein the polymer resin does not substantially absorb about 240 to 260 nm wavelength energy.

* * * * *